United States Patent [19]
Fuchs et al.

[11] 3,988,825
[45] Nov. 2, 1976

[54] METHOD OF HERMETICALLY SEALING AN ELECTRICAL COMPONENT IN A METALLIC HOUSING

[75] Inventors: Dieter Fuchs; Leopold Laber, both of Landshut, Germany

[73] Assignee: Jenaer Glaswerk Schott & Gen., Mainz, Germany

[22] Filed: Nov. 24, 1972

[21] Appl. No.: 309,375

[30] Foreign Application Priority Data
Nov. 24, 1971 Germany.............................. 2158188

[52] U.S. Cl.............................. 29/622; 29/25.35; 29/588; 174/52 H; 228/115; 357/74
[51] Int. Cl.² .................... H05K 5/06; H01L 21/52; H01L 23/10; H01H 45/02
[58] Field of Search ................ 174/52 S, 50.6, 50.5, 174/50.61, 50.54, 52 H; 29/470.1, 626, 588–591, 25.35, 622; 357/74, 75; 228/115

[56] References Cited
UNITED STATES PATENTS

| | | | |
|---|---|---|---|
| 3,020,454 | 2/1962 | Dixon, Jr. .................... | 174/52 S UX |
| 3,024,519 | 3/1962 | Leinkram et al............ | 29/470.1 UX |
| 3,065,390 | 11/1962 | Boswell et al.................. | 357/74 UX |
| 3,203,083 | 8/1965 | Obenhaus.......................... | 29/470.1 |
| 3,226,820 | 1/1966 | Anthony et al.................... | 29/470.1 |

*Primary Examiner*—Laramie E. Askin
*Attorney, Agent, or Firm*—Burgess, Dinklage & Sprung

[57] ABSTRACT

A hermetically sealed electrical component. A conductor passes through a metal body member in which it is sealed by a glass-to-metal seal, extending to the electrical component. The metal body member is soldered or brazed to a support plate. A cap enclosing the component is cold pressure welded to the support plate.

2 Claims, 12 Drawing Figures

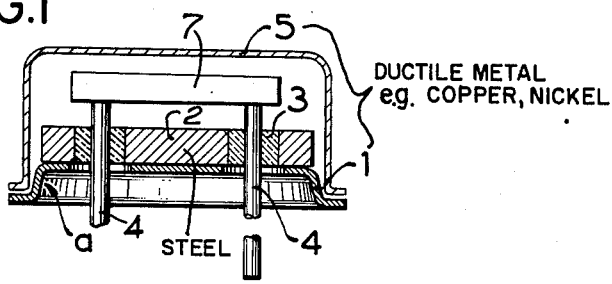
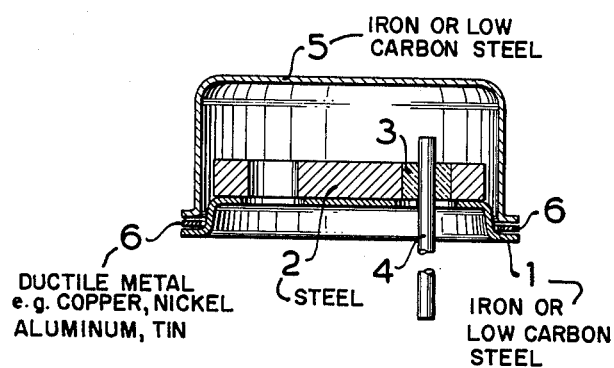
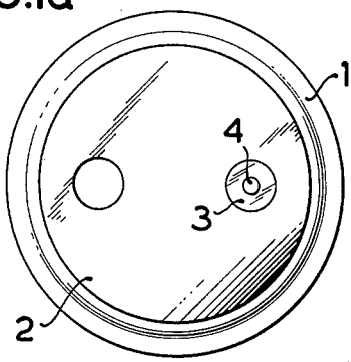
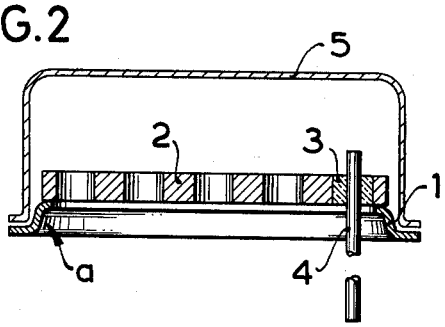
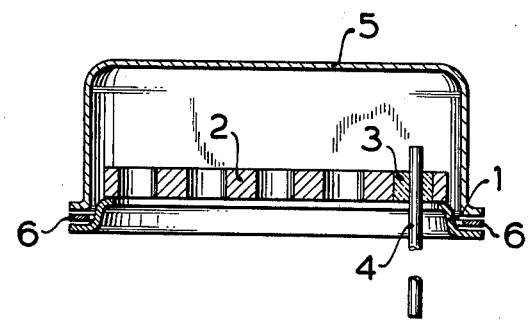
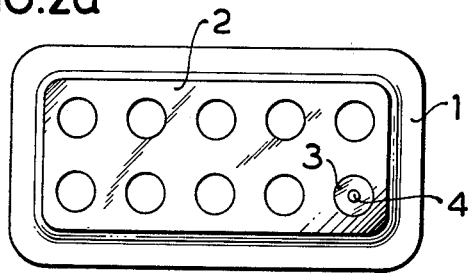

METHOD OF HERMETICALLY SEALING AN ELECTRICAL COMPONENT IN A METALLIC HOUSING

The invention relates to metal housings for the encapsulation of electrical components whose electrical connections are brought through the housing in a gastight manner by means of glass-to-metal seals, and in which the housing is sealed shut by cold pressure welding.

BACKGROUND

The encapsulation of semiconductor components, quartz crystal oscillators, relays and electrical assemblies must be performed hermetically in many applications. When the capsules are sealed shut by such common technical methods as brazing, soldering and resistance welding, trace impurities are formed within the capsule (brazing vapors, for example), which may impair the efficiency of operation of the component and thus detract from its reliability.

THE INVENTION

Cold pressure welding offers the advantage over common sealing methods that the joining together of the parts of the housing is performed without any great or substantial development of heat. At the same time, cold pressure welding can be conveniently performed in a protective gas atmosphere or in a vacuum. However, due to the great mechanical deformation involved in cold pressure welding there is a danger of transmitting intolerable mechanical stresses and strains to the glass-to-metal seal, often resulting in leaks and cracks in the glass insulator.

The object of the invention is to devise a form of construction for the manufacture of a capsule base capable of cold pressure welding in such a manner that:

1. The great mechanical deformation which occurs locally within the area of the weld will not have any harmful effect on the glass-to-metal seal;
2. A free choice of ductile materials can be used instead of the expensive special copper clad Kovar alloys commonly used hitherto;
3. The glass lead-through insulator will be a compressive glass-to-metal seal of great mechanical and thermal stability;
4. A less costly mass production will be made possible by the use of a compressive glass seal.

THE DRAWINGS

The invention will be explained with the aid of a variety of embodiments shown in the drawings, wherein:

FIG. 1 and FIG. 1a are, respectively, an elevation sectional view, and a bottom view of an embodiment wherein cold pressure welding is employed to join the housing parts together;

FIG. 1b is a modification of the construction of FIGS. 1 and 1a;

Figure 3:
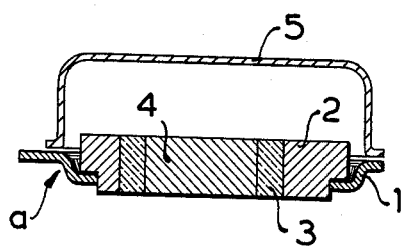
Figure 3A:
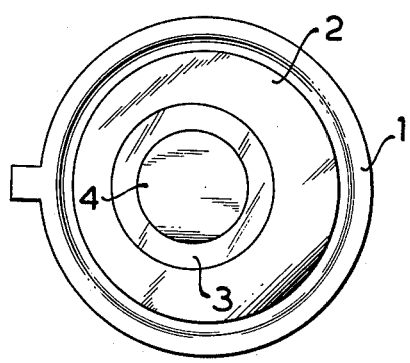
Figure 3B:
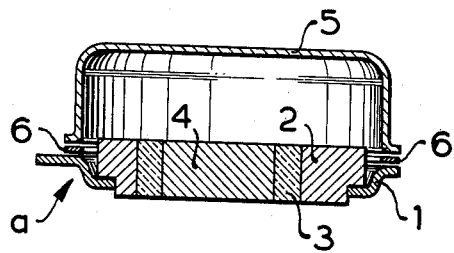
Figure 4:
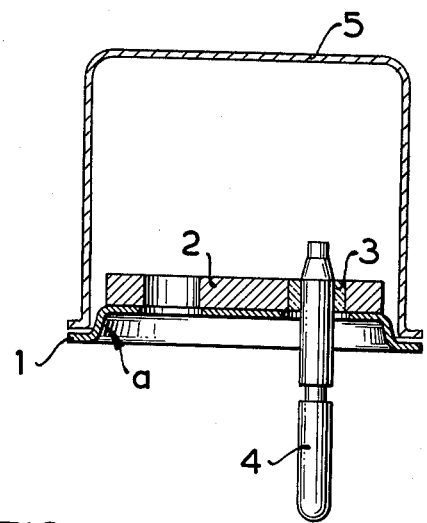
Figure 4A:
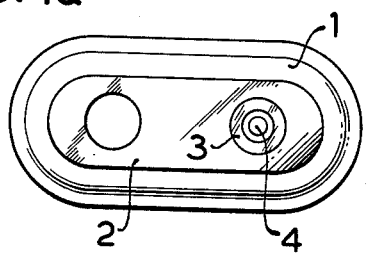
Figure 4B:
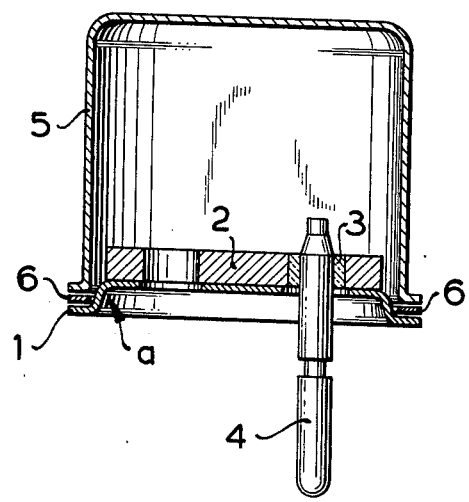

FIGS. 2, 2a, and 2b correspond, respectively, with FIGS. 1, 1a, and 1b, for a modified capsule construction;

FIGS. 3, 3a, and 3b do likewise for another modified capsule construction, as do also FIGS. 4, 4a and 4b.

In the drawings, like reference characters refer to corresponding parts.

In FIG. 1 and FIG. 1a is shown the construction of a housing or capsule in which the base (1–4) is divided construction-wise into the glass lead-through, consisting of: (a) a compression body 2 of steel; (b) the glass body 3 which is surrounded by the compression steel body 2; (c) a conductor material 4 passing through the glass body 3 and matched as regards thermal expansion to the glass body 3 (a known compressive glass lead-through), or a conductor material whose thermal expansion coefficient is smaller than that of the glass body (a known reinforced compressive glass lead-through); and (d) a support plate 1 which is provided for the cold pressure welding thereto of the cap 5, and is made of copper, nickel or other ductile material having good cold pressure welding characteristics.

The compressive glass seal assembly composed of metal body member 2, glass body 3 and conductor 4 can be joined to the support plate 1 in various ways:

1. The compressive glass seal assembly can be soldered to the support plate after the glassing-in process, with a low-melting solder (soldering temperature under 500° C);
2. Brazing between the compression steel body 2 and the support plate 1 can be performed together with the fusing process wherein the glass body 3 is formed about conductor 4, by means of brazing solder having a brazing temperature of about 950° C. Hereby stressing of the glass seal is reduced.

The cap 5 consists like the support plate of copper, nickel or other ductile, cold-weldable material.

The cold pressure welding between the housing cap 5 and the glass lead-through is performed on the support plate. According to the invention, the support plate has a zone $a$ whose purpose it is to absorb by its ductility the mechanical stresses and strains transmitted from the cold pressure weld zone and thereby to mechanically relieve the compression glass seal. The zone $a$ is provided by axially offsetting the flange of support plate 1 from the body portion thereof. Zone $a$ is, so to speak, a crumple zone.

When a support plate of this kind is used, it is possible to enclose hermetically, by cold pressure welding, such electrical component 7 as, for example, quartz crystal oscillators, relays, micromodules, reed relays and the like.

FIG. 2 shows a housing for the encapsulation of relays, with its base made in accordance with the invention.

FIGS. 3 and 4 show additional possibilities for cold pressure welding housings.

FIGS. 1b, 2b, 3b, and 4b show the construction of forms of housings in which a bonding medium is interposed between the support plate 1 and the cap 5. Such construction is used whenever, for metallurgical or other reasons, a support plate material has to be used which has poor cold pressure welding characteristics (e.g., an iron or iron alloy).

Such bonding (using of a bonding medium) of the cap 5 to support plate 1 is also performed whenever the mechanical deformations involved in cold pressure welding have to be held to a minimum or are unacceptable. The bonding medium (in FIGS. 1b, ring 6; in FIG. 2b, ring 6, in FIG. 3b, ring 6; in FIG. 4b, ring 6) is a thin ring piece of a soft, ductile material which may consist, for example, of copper, nickel, aluminum, tin, etc., depending on the application involved.

SUMMARY

Thus the invention comprises an electrical component, a housing enclosing and hermetically sealing the electrical component and a conductor passing through the housing and electrically connected to the component. The housing comprises a metal body member having an opening therein through which the conductor passes; a glass body disposed in said opening in sealing relation with the metal body member and the conductor, i.e. a glass-to-metal seal between the conductor and the glass body and between the glass body and the metal body member; a support plate for the metal body having an opening through which the conductor passes, and comprising a body portion to which the metal body member is bonded by a soldered or brazed joint and a flange disposed outwardly of the body portion thereof; and a cap extending over the metal body member and support plate encapsulating the metal body member and electrical component, and having a flange joined to the flange of the support plate, in hermetically sealed relation by cold pressure welding.

Desirably the flange of the support plate is axially offset from the body portion of the support plate for equalization of tension arising from the welded flange to the support plate flange.

EXAMPLE

An assembly composed of a compressive glass lead-through formed by steel metal body 2, copper conductor 4, and glass seal 3 is soldered or brazed to the soft copper support plate 1 with a solder of the following composition: 50% Cu + 50% Ag, soldering temperature 870° C. or 97.5% Pb + 2.5% Ag, soldering temperature 304° C. The support plate is formed of soft copper. Thereafter a cap 5 formed of the same copper metal is cold pressure welded by forging the flange of the cap and the flange of the support plate together so that the flanges adhere providing a hermetic seal.

As an alternative construction, the assembly can be provided as is indicated in FIG. 1b, with the support plate 1 being iron or low carbon steel and the cap being low carbon steel. A ring shaped thin foil 6, which is 0.2–0.4 mm in thickness, composed of soft ductile tin, copper or alloys thereof is interposed between the flanges of the cap and the support plate. By application of pressure the flanges are joined together by cold pressure through the medium of the ring 6, providing a hermetic seal.

What is claimed is:

1. Method of hermetically sealing an electrical component in a housing through which an electrical conductor passes, the conductor being electrically connected to the component within the housing, said housing comprising:
   a. a metal body member having an opening therein through which the conductor passes,
   b. a glass body disposed in said opening in sealing relation with the metal body and the conductor, said metal body and glass body forming a compressive glass lead through or a reinforced compressive glass lead through for the conductor,
   c. a metal support plate for the metal body having an opening through which the conductor passes and comprising a body portion and a flange disposed outwards of the body portion, the opening in the metal body member being radially inward of the opening in the metal support plate,
   d. a metal cap extending over the metal body member and metal support plate encapsulating the metal body member and electrical component and having a flange joined to the flange of the metal support plate in hermetically sealed relation, the method comprising bonding the metal body member to the metal support plate by soldering or brazing and effecting said joining of the flanges of the metal cap and metal support plate by cold pressure welding, and simultaneously with said bonding of the metal body to the metal support plate, forming said glass body in sealing relation as aforesaid.

2. Method according to claim 1, wherein the metal body is bonded to the metal support plate by brazing.

* * * * *